United States Patent
Chen et al.

(10) Patent No.: US 10,390,617 B2
(45) Date of Patent: Aug. 27, 2019

(54) BRACKET FOR SLIDE RAIL

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/723,368

(22) Filed: Oct. 3, 2017

(65) Prior Publication Data
US 2018/0271275 A1    Sep. 27, 2018

(30) Foreign Application Priority Data
Mar. 27, 2017    (TW) .............................. 106110189 A

(51) Int. Cl.
| A47B 88/43 | (2017.01) |
| A47B 88/49 | (2017.01) |
| H05K 7/14 | (2006.01) |
| A47B 88/423 | (2017.01) |

(52) U.S. Cl.
CPC .............. *A47B 88/43* (2017.01); *A47B 88/49* (2017.01); *H05K 7/1489* (2013.01); *A47B 2088/4235* (2017.01); *H05K 7/14* (2013.01)

(58) Field of Classification Search
CPC ....... A47B 57/38; A47B 96/07; A47B 57/406; A47B 57/40; A47B 57/16; A47B 57/14
USPC ....... 248/18.4, 219.1, 219.3, 221.11, 222.14, 248/244; 211/192, 26, 162, 175, 782
See application file for complete search history.

(56) References Cited

U.S. PATENT DOCUMENTS

| 4,406,374 | A | * | 9/1983 | Yedor | .................... | A47B 57/40 211/192 |
| 4,712,286 | A | * | 12/1987 | Wolf | ...................... | A47B 57/40 138/160 |
| 6,929,339 | B1 | * | 8/2005 | Greenwald | .......... | H05K 7/1421 211/26 |
| 6,948,691 | B2 | * | 9/2005 | Brock | ...................... | H02B 1/34 211/175 |
| 8,104,626 | B2 | * | 1/2012 | Huang | ................... | A47B 88/43 211/26 |
| 8,727,138 | B2 | * | 5/2014 | Dittus | .................... | H05K 7/183 211/26 |

(Continued)

*Primary Examiner* — Muhammad Ijaz
(74) *Attorney, Agent, or Firm* — Rosenberg, Klein & Lee

(57) ABSTRACT

A bracket adapted for mounting a slide rail to a post of a rack includes a bracket plate, a mounting member, a first fastening member, and an engaging base. The bracket plate is attached to the slide rail. The mounting member is connected to the bracket plate and can be mounted to the post. The first fastening member is movably mounted on the bracket plate and has a fastening portion to be locked to the post. The engaging base is coupled to the first fastening member and includes first and second portions. A second fastening member can enter a space between the second portion and the first fastening member, engage with the second portion, and thus be prevented from detachment from the engaging base.

20 Claims, 11 Drawing Sheets

(56) References Cited

U.S. PATENT DOCUMENTS

| | | | |
|---|---|---|---|
| 9,125,489 B2* | 9/2015 | Chen | A47B 88/43 |
| 9,370,120 B2 | 6/2016 | Chen et al. | |
| 9,375,087 B1* | 6/2016 | Chen | A47B 88/43 |
| 2001/0040203 A1* | 11/2001 | Brock | H02B 1/34 |
| | | | 248/222.11 |
| 2004/0104184 A1* | 6/2004 | Hartman | G06F 1/183 |
| | | | 211/26 |
| 2004/0108427 A1* | 6/2004 | Chen | A47B 57/40 |
| | | | 248/244 |
| 2007/0012836 A1* | 1/2007 | Krueger | H05K 7/1421 |
| | | | 248/239 |
| 2008/0067907 A1* | 3/2008 | Chen | A47B 88/43 |
| | | | 312/312 |
| 2008/0073469 A1* | 3/2008 | Mushan | H05K 7/1489 |
| | | | 248/205.1 |
| 2009/0114785 A1* | 5/2009 | Huang | H05K 7/1489 |
| | | | 248/220.31 |
| 2009/0166485 A1* | 7/2009 | Chen | A47B 88/43 |
| | | | 248/200 |
| 2010/0072153 A1* | 3/2010 | Chen | H05K 7/1421 |
| | | | 211/183 |
| 2012/0312943 A1* | 12/2012 | Fan | H05K 7/1489 |
| | | | 248/222.11 |
| 2013/0032678 A1* | 2/2013 | Chen | H05K 7/1421 |
| | | | 248/224.8 |
| 2014/0070064 A1* | 3/2014 | Chen | A47B 88/43 |
| | | | 248/221.11 |
| 2014/0117180 A1* | 5/2014 | Chen | H05K 7/1489 |
| | | | 248/219.1 |
| 2014/0186106 A1* | 7/2014 | Gu | A47B 88/044 |
| | | | 403/327 |
| 2014/0265788 A1* | 9/2014 | Judge | H05K 7/1489 |
| | | | 312/334.1 |
| 2014/0363109 A1* | 12/2014 | Chen | A47B 88/43 |
| | | | 384/22 |
| 2015/0201754 A1* | 7/2015 | Chen | A47B 96/025 |
| | | | 248/219.3 |
| 2016/0165741 A1* | 6/2016 | Chen | H05K 7/1489 |
| | | | 248/219.3 |
| 2016/0324317 A1* | 11/2016 | Chen | A47B 88/43 |
| 2017/0290424 A1* | 10/2017 | Chen | A47B 88/044 |
| 2018/0084908 A1* | 3/2018 | Chen | A47B 57/487 |

* cited by examiner

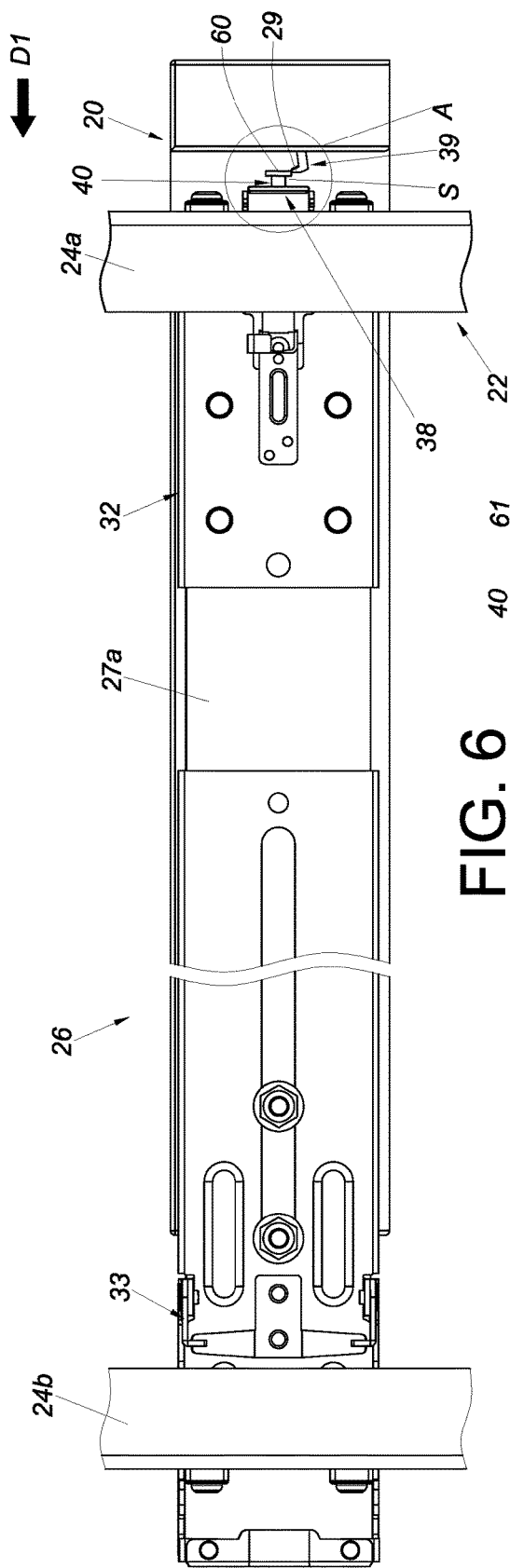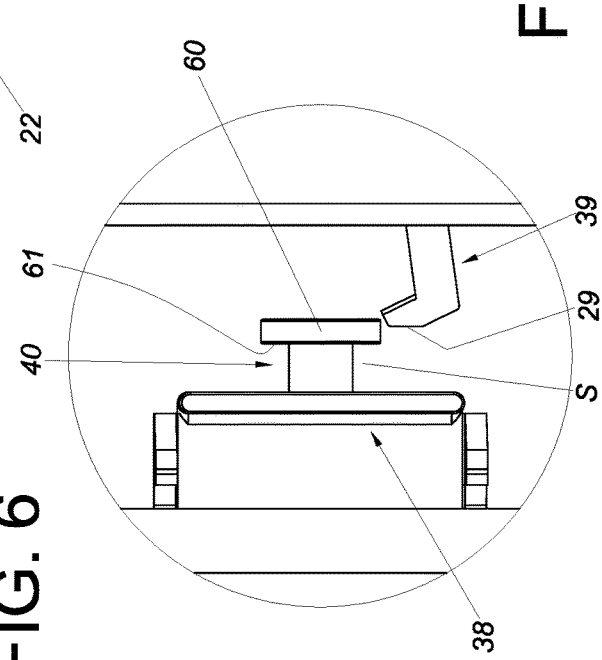

BRACKET FOR SLIDE RAIL

FIELD OF THE INVENTION

The present invention relates to a bracket and more particularly to one for use with a slide rail.

BACKGROUND OF THE INVENTION

Generally, a slide rail assembly (or slide rail) in a rack-based system is mounted on two posts of a rack via two brackets respectively. An object, therefore, can be mounted to the rack through the slide rail assembly. The slide rail assembly also allows the object to stay in the rack and be pulled out of the rack whenever necessary. U.S. Pat. No. 9,370,120 B2, for example, discloses a slide assembly for installing a chassis to a rack. This slide assembly at least includes an engaging member pivotally connected to the bracket board of a bracket. The engaging member includes a body portion, a first fastening portion, and a second fastening portion, wherein the second fastening portion is configured to form an engaging space with respect to the first fastening portion. The at least one hook portion of the chassis can be inserted into the engaging space of the engaging member from below to contact against the second fastening portion, thereby preventing the chassis from being pulled out of the rack by a random attempt. The disclosure of this US patent is incorporated herein by reference.

SUMMARY OF THE INVENTION

The present invention relates to a bracket and/or slide rail assembly that includes an engaging base with which a fastening member of an object can engage.

According to one aspect of the present invention, a bracket adapted for mounting a slide rail to a post includes a bracket plate, at least one mounting member, a first fastening member, and an engaging base. The bracket plate is attached to the slide rail. The at least one mounting member is connected to the bracket plate and is configured to be mounted to the post. The first fastening member is movably mounted on the bracket plate, and when the first fastening member in a locking state, a fastening portion of the first fastening member is in front of and adjacent to the post. The engaging base is coupled to the first fastening member and includes a first portion and a second portion connected to the first portion. The second portion includes a plurality of engaging features. The second portion and the first fastening member form a space therebetween. A second fastening member can enter the space and engage with the engaging features of the second portion in order not to detach from the engaging base.

Preferably, when the first fastening member is in the locking state, the fastening portion of the first fastening member is adjacent to the at least one mounting member.

Preferably, the first fastening member is pivotally connected to the bracket plate, and the bracket further includes an elastic member for applying an elastic force to the first fastening member and thereby keeping the first fastening member in the locking state.

Preferably, the first portion has a first contour, and the second portion has a second contour larger than the first contour.

Preferably, the space is an open space.

Preferably, the engaging base and the first fastening member are fixedly joined together.

The engaging base and the first fastening member may alternatively be detachably coupled together.

Preferably, the engaging features of the second portion of the engaging base are outwardly protrudingly provided with respect to the first portion over a range of 360 degrees so that the second fastening member can engage with the engaging features from any direction.

Preferably, the bracket plate includes a lateral portion and an end portion bent with respect to the lateral portion, wherein the at least one mounting member is connected to the end portion of the bracket plate, and the first fastening member is pivotally connected to the lateral portion of the bracket plate.

According to another aspect of the present invention, a slide rail assembly is adapted for mounting an object to a rack. The slide rail assembly includes a first rail and a second rail. The first rail is mountable to a first post of the rack via a first bracket according to the foregoing aspect of the present invention, and the first rail is mountable to a second post of the rack via a second bracket. The second rail can be displaced with respect to the first rail and is configured for carrying the object. The at least one mounting member is configured to be mounted to the first post. The elastic member applies an elastic force to the first fastening member in order for the fastening portion of the first fastening member to stay in front of and adjacent to the first post in response to the elastic force. When the second rail is at a retracted position with respect to the first rail, a second fastening member of the object can enter the space and engage with the engaging features of the second portion in order not to detach from the engaging base.

BRIEF DESCRIPTION OF THE DRAWINGS

FIG. 6 shows that the second rail of the slide rail assembly in FIG. 5 is further displaced in the predetermined direction with respect to the first rail;

FIG. 7 is an enlarged view of the circled area A in FIG. 6;

DETAILED DESCRIPTION OF THE INVENTION

Figure 1:
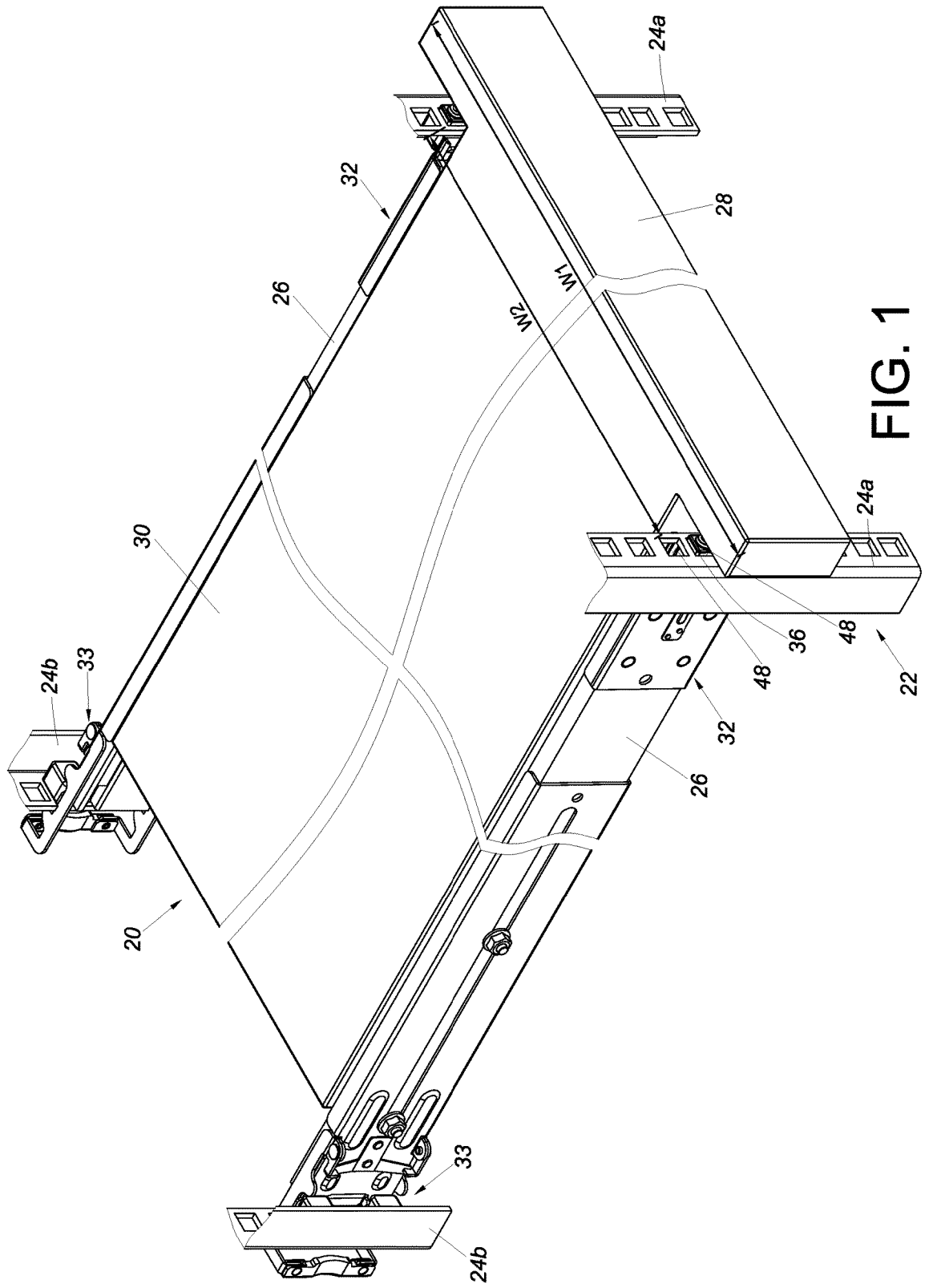
FIG. 1 is a perspective view showing how an object is mounted to a rack in accordance with an embodiment of the present invention.

FIG. 1 shows how an object 20 is mounted to a rack 22 via an embodiment of the present invention. The object 20 may be a chassis, a piece of electronic equipment, a drawer, or the like. The rack 22 at least includes a first post 24a and a second post 24b. More specifically, a slide rail 26 is mounted to the first post 24a (also referred to herein as the post) through a bracket 32 and is mounted to the second post 24b through another bracket 33. The slide rail 26 is configured to support or carry the object 20. Here, the object 20 includes a front portion 28 and a rear portion 30 by way of example. The front portion 28 has a first width W1, and the rear portion 30 has a second width W2. The first width W1 is greater than the second width W2.

Figure 2:
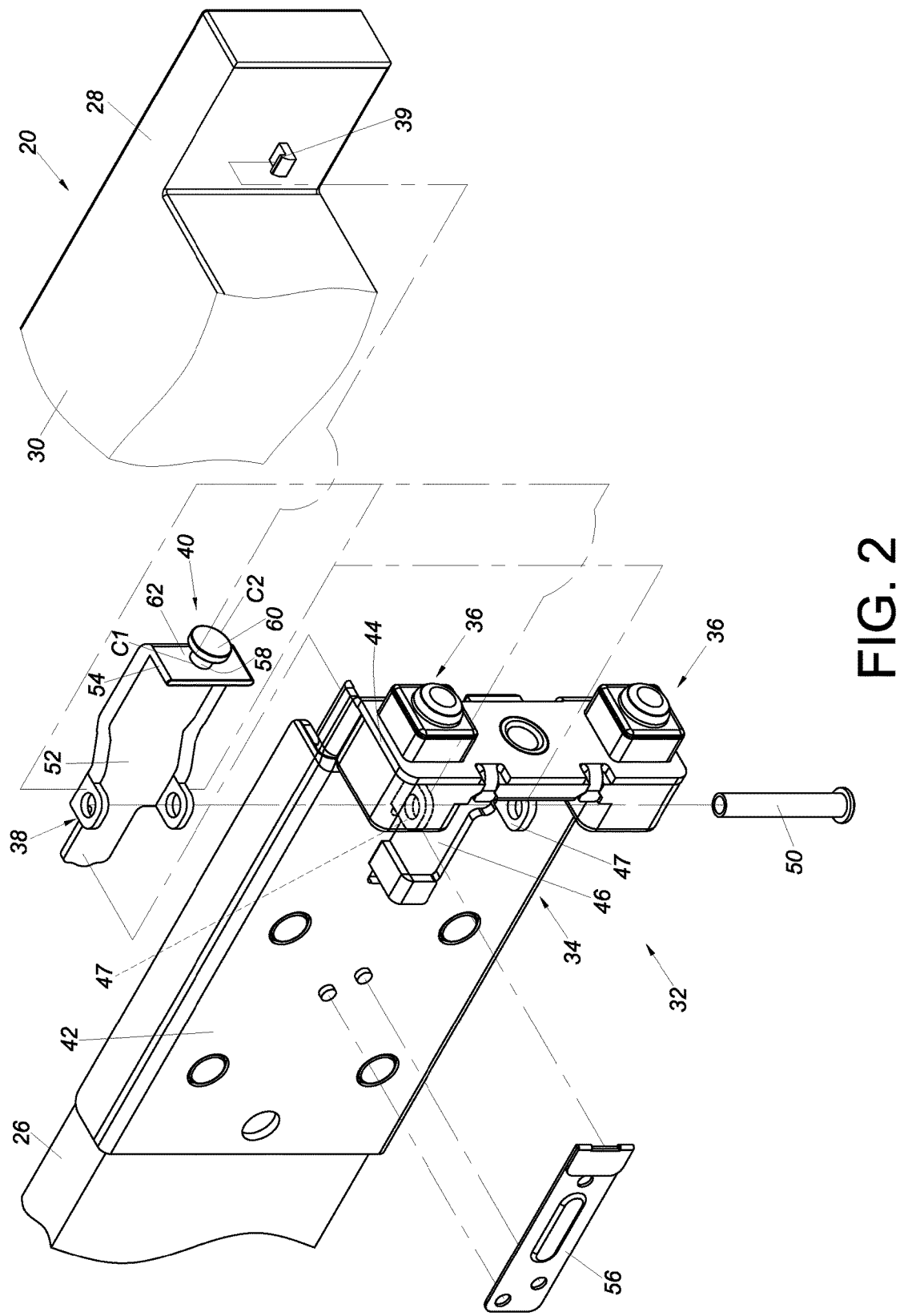
FIG. 2 is an exploded perspective view of a bracket in an embodiment of the present invention, along with an object.
Figure 3:
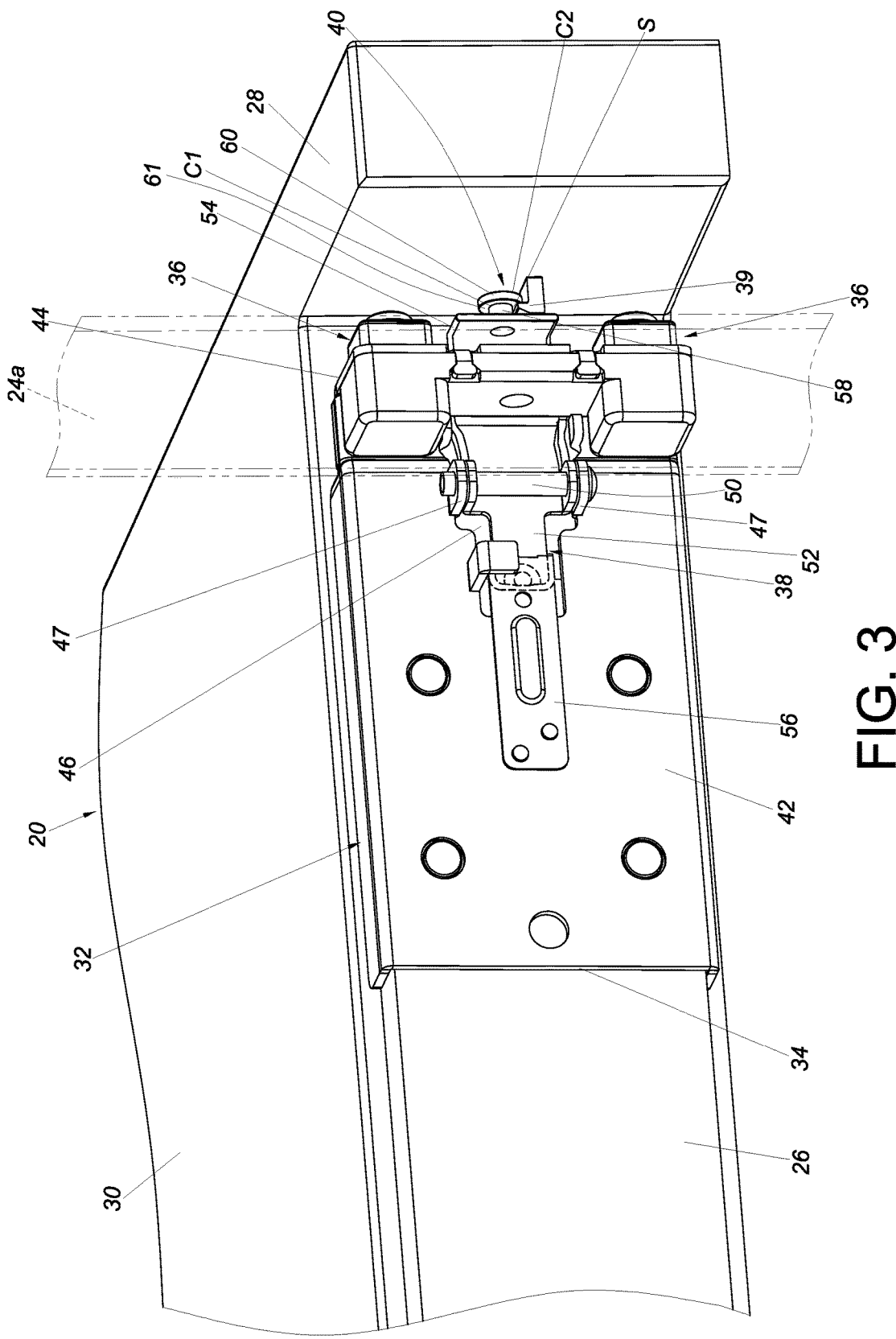
FIG. 3 is a perspective view showing how a slide rail is mounted to a post of a rack via a bracket in accordance with an embodiment of the present invention, wherein a second fastening member of an object engages with a first fastening member of the bracket.

Referring also to FIG. 2 and FIG. 3, the slide rail 26 is mounted to the first post 24a by the bracket 32. More specifically, the bracket 32 includes a bracket plate 34, at least one mounting member 36, a first fastening member 38, and an engaging base 40. The object 20 includes a second fastening member 39, which is provided at the front portion 28.

The bracket plate 34 is attached to the slide rail 26. For example, the bracket plate 34 is fixedly attached to the slide rail 26 by riveting, threaded connection, or the like. The bracket plate 34 preferably includes a lateral portion 42 and an end portion 44 bent with respect to the lateral portion 42. Preferably, the end portion 44 is substantially perpendicularly connected to the lateral portion 42, and the lateral portion 42 has an opening 46 and at least one lug 47 (e.g., two lugs 47) adjacent to the opening 46.

The at least one mounting member 36 (e.g., two mounting members 36) is connected to the bracket plate 34. Here, the at least one mounting member 36 is connected to the end portion 44 of the bracket plate 34 and is configured to be mounted to a hole 48 (see FIG. 1) of the first post 24a.

The first fastening member 38 is movably mounted on the bracket plate 34. For example, the first fastening member 38 is pivotally connected to the bracket plate 34 via a pin 50. More specifically, the pin 50 is pivotally connected to the at least one lug 47 of the lateral portion 42 of the bracket plate 34. Preferably, the first fastening member 38 includes a connecting portion 52 and a fastening portion 54 bent with respect to the connecting portion 52, and the fastening portion 54 is substantially perpendicularly connected to the connecting portion 52. It is the connecting portion 52 of the first fastening member 38 that is pivotally connected to the bracket plate 34. The connecting portion 52 has a part corresponding to the opening 46 of the bracket plate 34. When the first fastening member 38 is in a locking state, the fastening portion 54 of the first fastening member 38 is adjacent to the at least one mounting member 36 and is in front of and adjacent to the first post 24a. Preferably, an elastic member 56 applies an elastic force to the first fastening member 38 so that the first fastening member 38 stays in the locking state in response to the elastic force. The elastic member 56 may be an elastic plate or spring; the present invention has no limitation in this regard.

The engaging base 40 is coupled to the first fastening member 38. More specifically, the engaging base 40 may be detachably coupled to the first fastening member 38 or fixedly joined to the first fastening member 38; the present invention has no limitation in this regard. In some embodiments, the engaging base 40 and the fastening portion 54 of the first fastening member 38 are fixedly joined in one-piece formation by way of example. The engaging base 40 includes a first portion 58 and a second portion 60. The second portion 60 is preferably connected to the first portion 58. Preferably, the second portion 60 includes a plurality of engaging features 61, wherein the engaging features 61 may be any two positions on the second portion 60. Preferably, the first portion 58 of the engaging base 40 has a first contour C1, and the second portion 60 has a second contour C2 larger than the first contour C1. The plural engaging features 61, therefore, may be a surface of the second portion 60. The second portion 60 and a surface 62 of the first fastening member 38 form an open space S therebetween. A target object, e.g., the second fastening member 39 of the object 20, can enter the space S from any direction, and the engaging features 61 of the second portion 60 can prevent the second fastening member 39 of the object 20 from being detached from the engaging base 40. In this embodiment, and by way of example, the second fastening member 39 of the object 20 is configured to engage with the second portion 60 from below.

Figure 4:
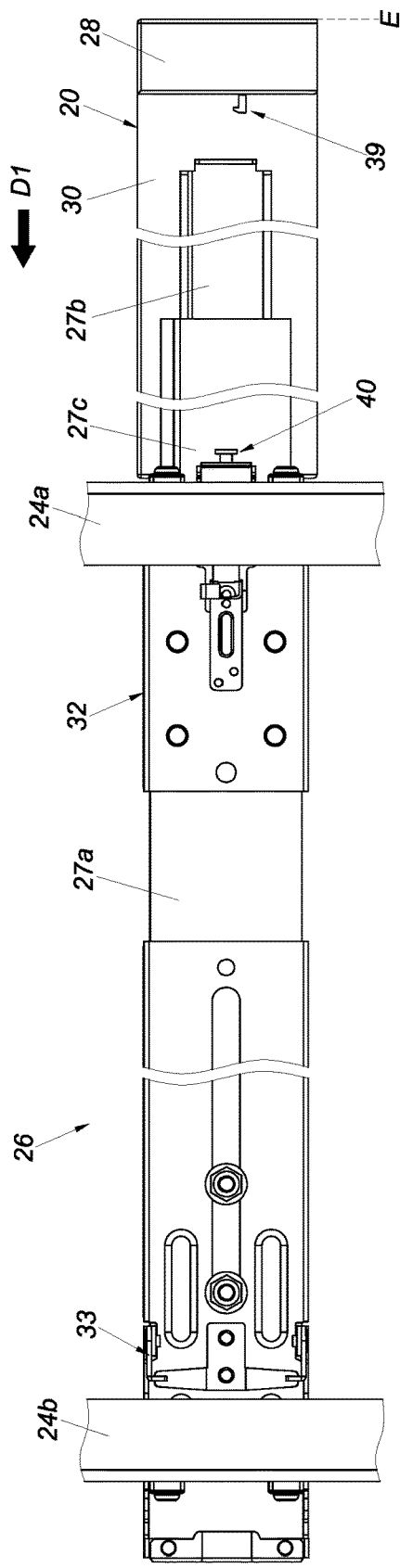
FIG. 4 shows that a slide rail assembly in an embodiment of the present invention includes a first rail and a second rail, wherein the second rail carries an object and is at an extended position with respect to the first rail.
Figure 5:
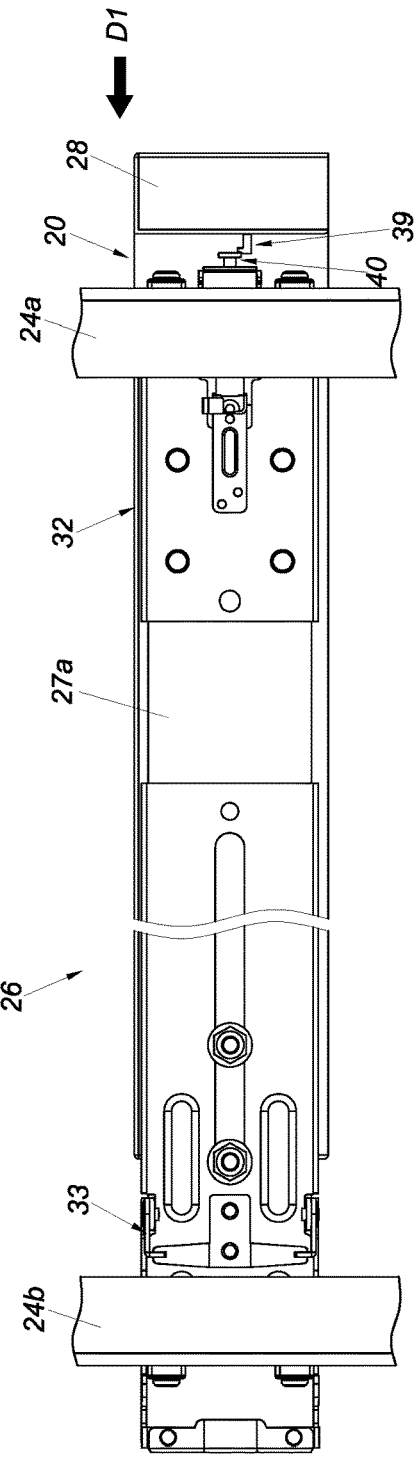
FIG. 5 shows that the second rail of a slide rail assembly in an embodiment of the present invention is retracted, i.e., displaced in a predetermined direction, with respect to the first rail from the extended position.

Referring to FIG. 4 and FIG. 5, the slide rail 26 includes a first rail 27a and a second rail 27b. The second rail 27b can be displaced with respect to the first rail 27a and is configured to carry the object 20. Preferably, the slide rail 26 further includes a third rail 27c movably mounted between the first rail 27a and the second rail 27b to increase the distance by which the second rail 27b can be extended with respect to the first rail 27a. More specifically, the first rail 27a is mounted to the first post 24a and the second post 24b via the bracket 32 (also referred to herein as the first bracket) and the other bracket 33 (also referred to herein as the second bracket). When the second rail 27b is retracted from an extended position E with respect to the first rail 27a (i.e., displaced in a first direction D1) and is about to reach a retracted position R, the second fastening member 39 of the front portion 28 of the object 20 comes into contact with the engaging base 40.

Figure 8:
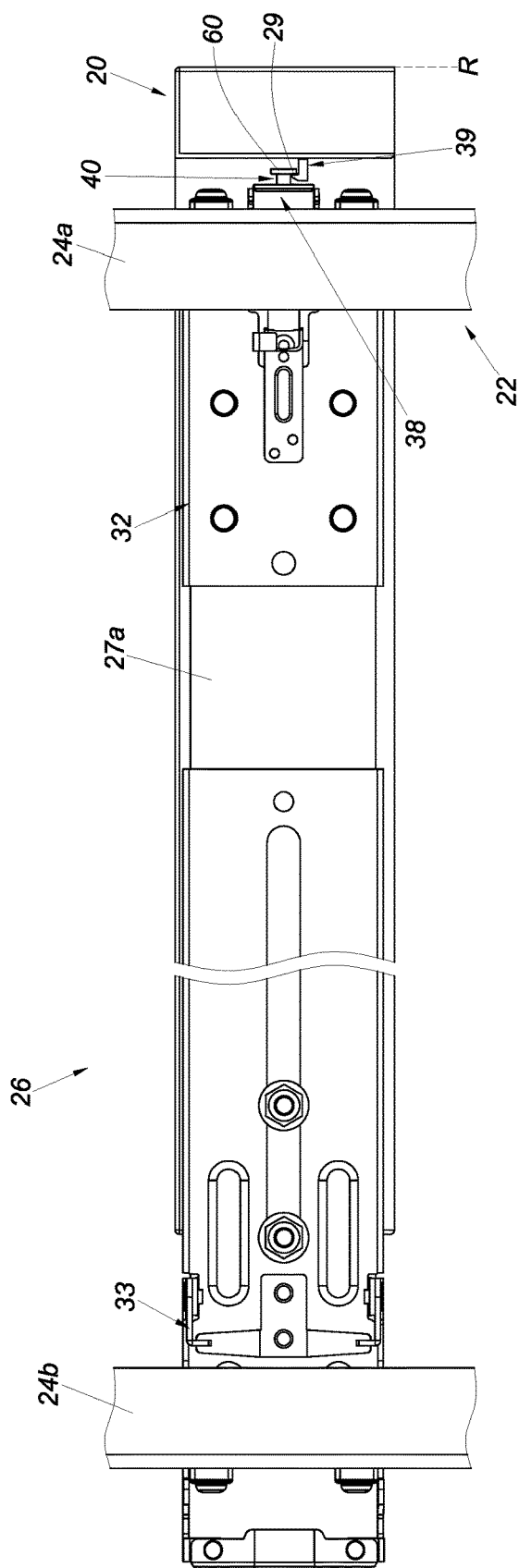
FIG. 8 shows that the second rail of a slide rail assembly in an embodiment of the present invention is at a retracted position with respect to the first rail.

Referring to FIG. 6 to FIG. 8, when the second rail 27b reaches the retracted position R after further displacement with respect to the first rail 27a in the first direction D1, the second fastening member 39 of the object 20 can be operated to engage with the engaging base 40. Thus, with the second rail 27b at the retracted position R with respect to the first rail 27a, the object 20 cannot be separated from the rack 22 by a random attempt. Preferably, one of the second fastening member 39 and the engaging base 40 includes a guiding feature 29 (e.g., an inclined or curved surface). Here, by way of example, it is the second fastening member 39 that has the guiding feature 29. The guiding feature 29 makes it easier for the second fastening member 39 to enter the space S between the second portion 60 of the engaging base 40 and the first fastening member 38 by pivoting through a certain angle and then engage with the engaging features 61 of the second portion 60 of the engaging base 40.

Figure 9:
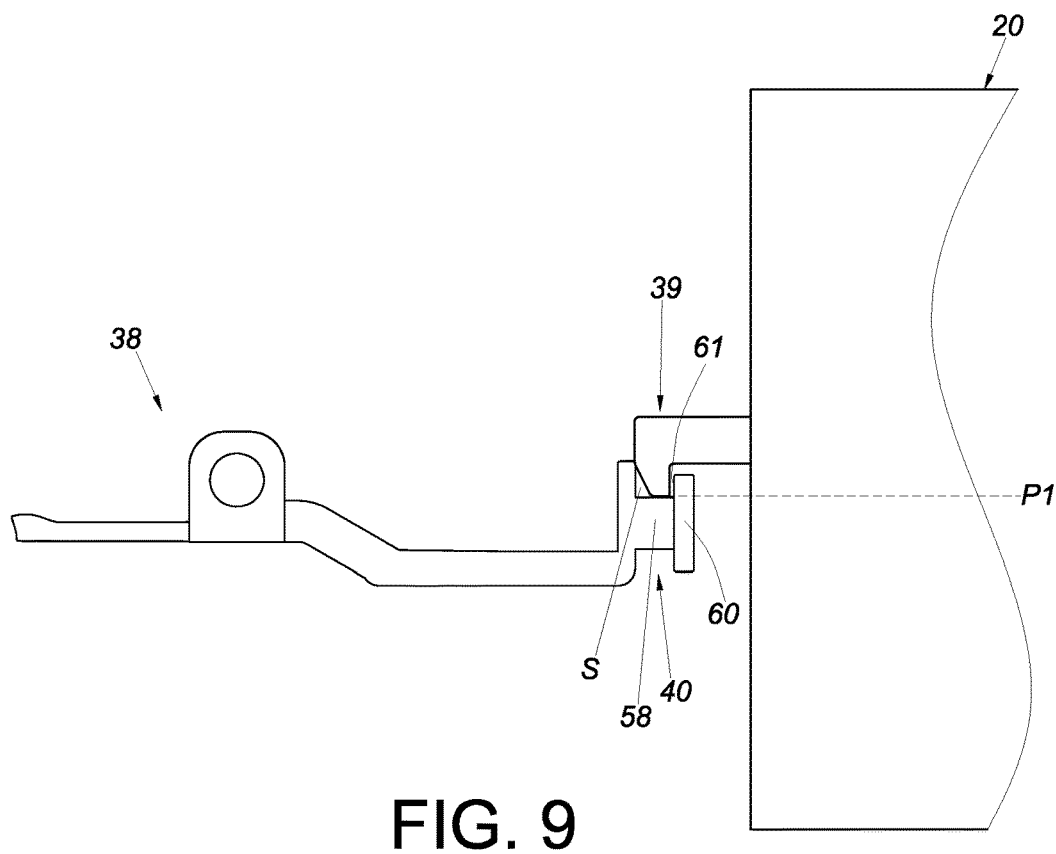
FIG. 9 shows the first configuration in accordance with an embodiment of the present invention, in which the second fastening member of an object can engage with the engaging base of the bracket from above.

In the first engaging configuration as shown in FIG. 9, the second fastening member 39 of the object 20 enters the space S of the engaging base 40 from above and, after engaging with the engaging base 40, is at a first position P1, e.g., a position above the engaging base 40.

Figure 10:
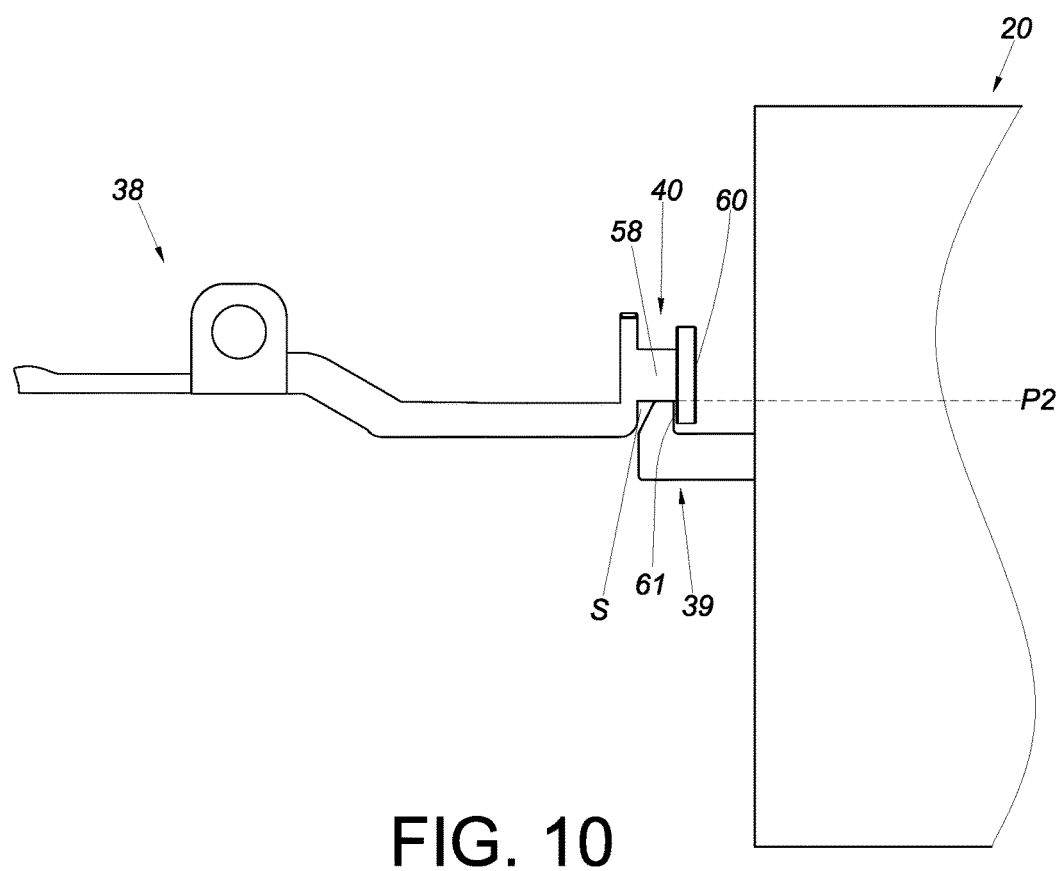
FIG. 10 shows the second configuration in accordance with an embodiment of the present invention, in which the second fastening member of an object can engage with the engaging base of the bracket from below.

In the second engaging configuration as shown in FIG. 10, the second fastening member 39 of the object 20 enters the space S of the engaging base 40 from below and, after engaging with the engaging base 40, is at a second position P2, e.g., a position under the engaging base 40.

Figure 11:
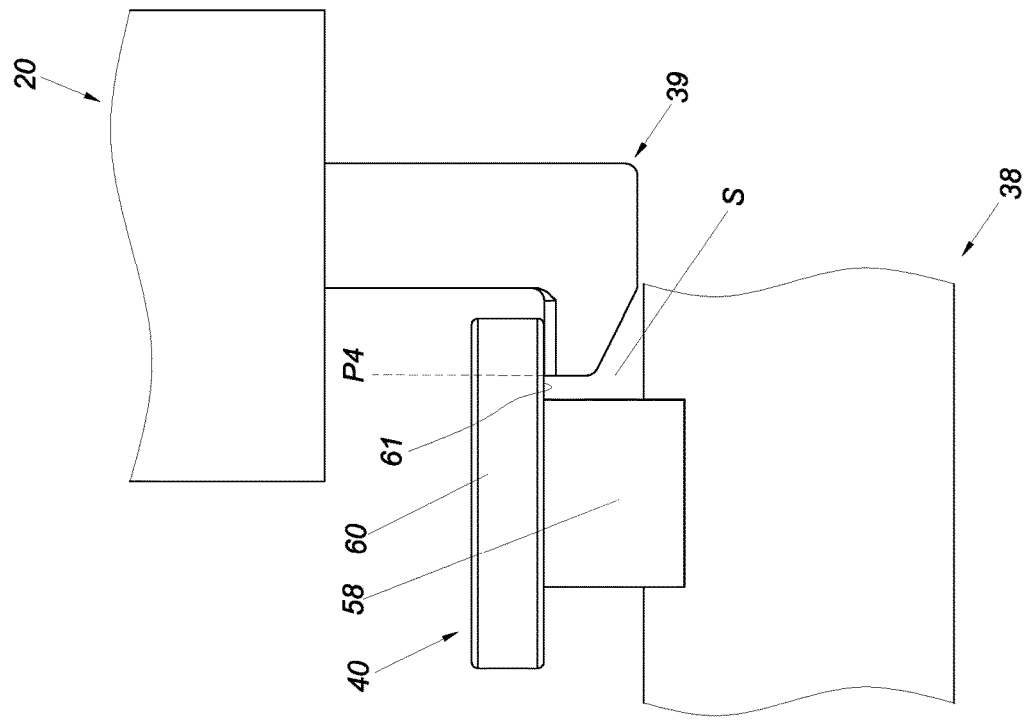
FIG. 11 shows the third configuration in accordance with an embodiment of the present invention, in which the second fastening member of an object can engage with the engaging base of the bracket from the left.

In the third engaging configuration as shown in FIG. 11, the second fastening member 39 of the object 20 enters the space S of the engaging base 40 from the left and, after engaging with the engaging base 40, is at a third position P3, e.g., a position to the left of the engaging base 40.

Figure 12:
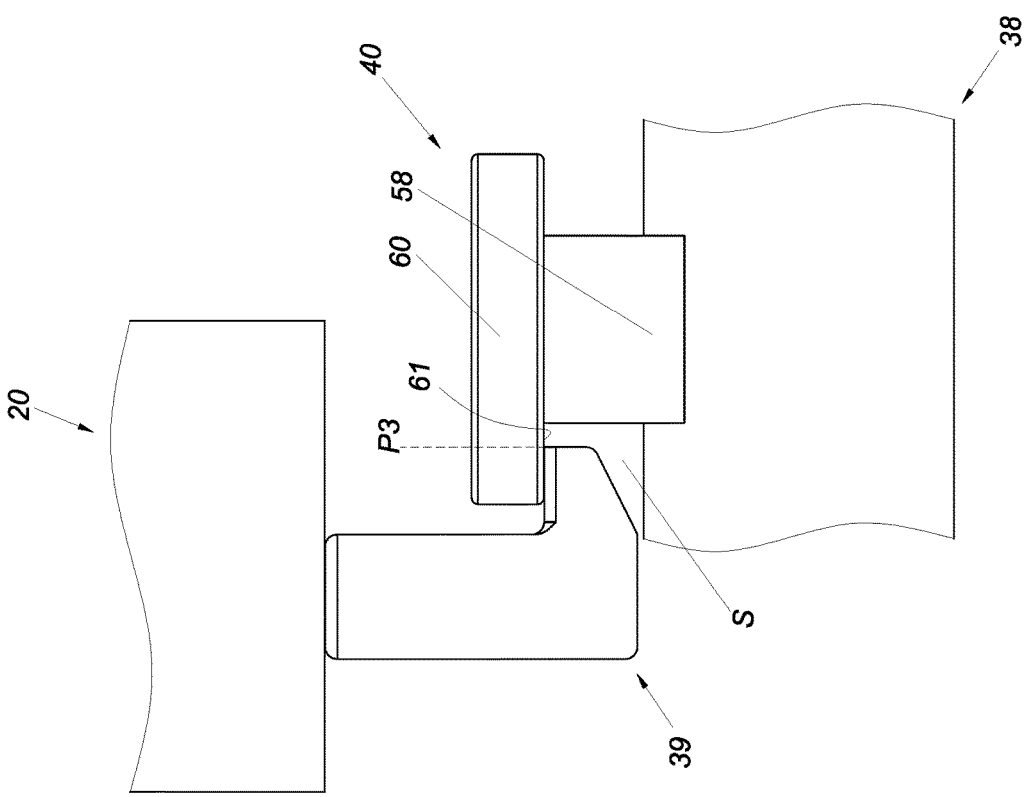
FIG. 12 shows the fourth configuration in accordance with an embodiment of the present invention, in which the second fastening member of an object can engage with the engaging base of the bracket from the right.

In the fourth engaging configuration as shown in FIG. 12, the second fastening member 39 of the object 20 enters the space S of the engaging base 40 from the right and, after engaging with the engaging base 40, is at a fourth position P4, e.g., a position to the right of the engaging base 40.

It can be known from the above that the second fastening member 39 of the object 20 can engage with the engaging base 40 from different directions. In other words, the engaging base 40 can adapt to the orientation of the second fastening member 39 of the object 20. Preferably, the plural engaging features 61 of the second portion 60 of the engaging base 40 are outwardly protrudingly provided with respect to the first portion 58 over a range of 360 degrees so that the second fastening member 39 of the object 20 can engage with the engaging features 61 of the second portion 60 of the engaging base 40 from any direction.

Figure 13:
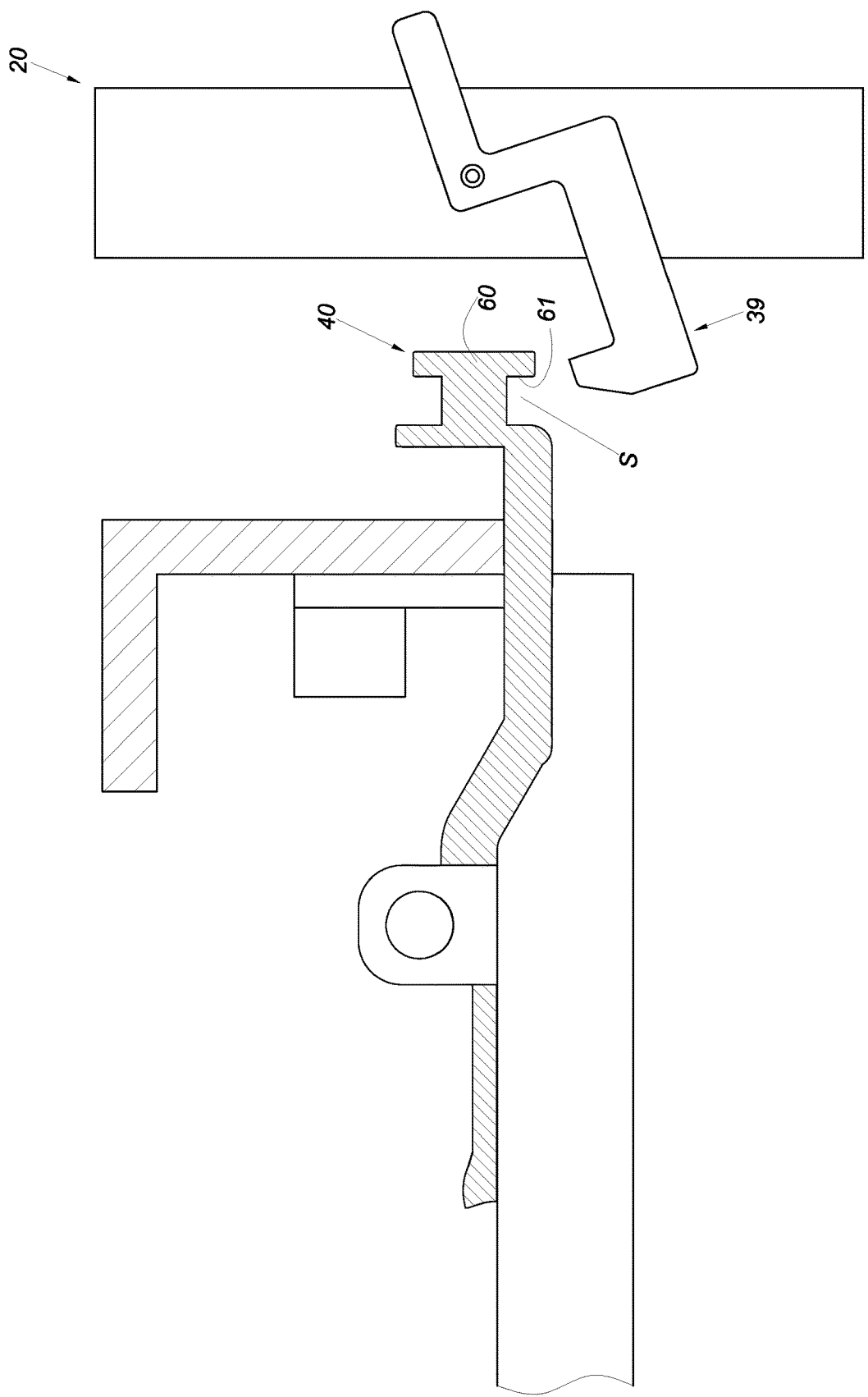
FIG. 13 shows that the second fastening member of an object and the engaging base of the bracket in an embodiment of the present invention are in an unlocked state.
Figure 14:
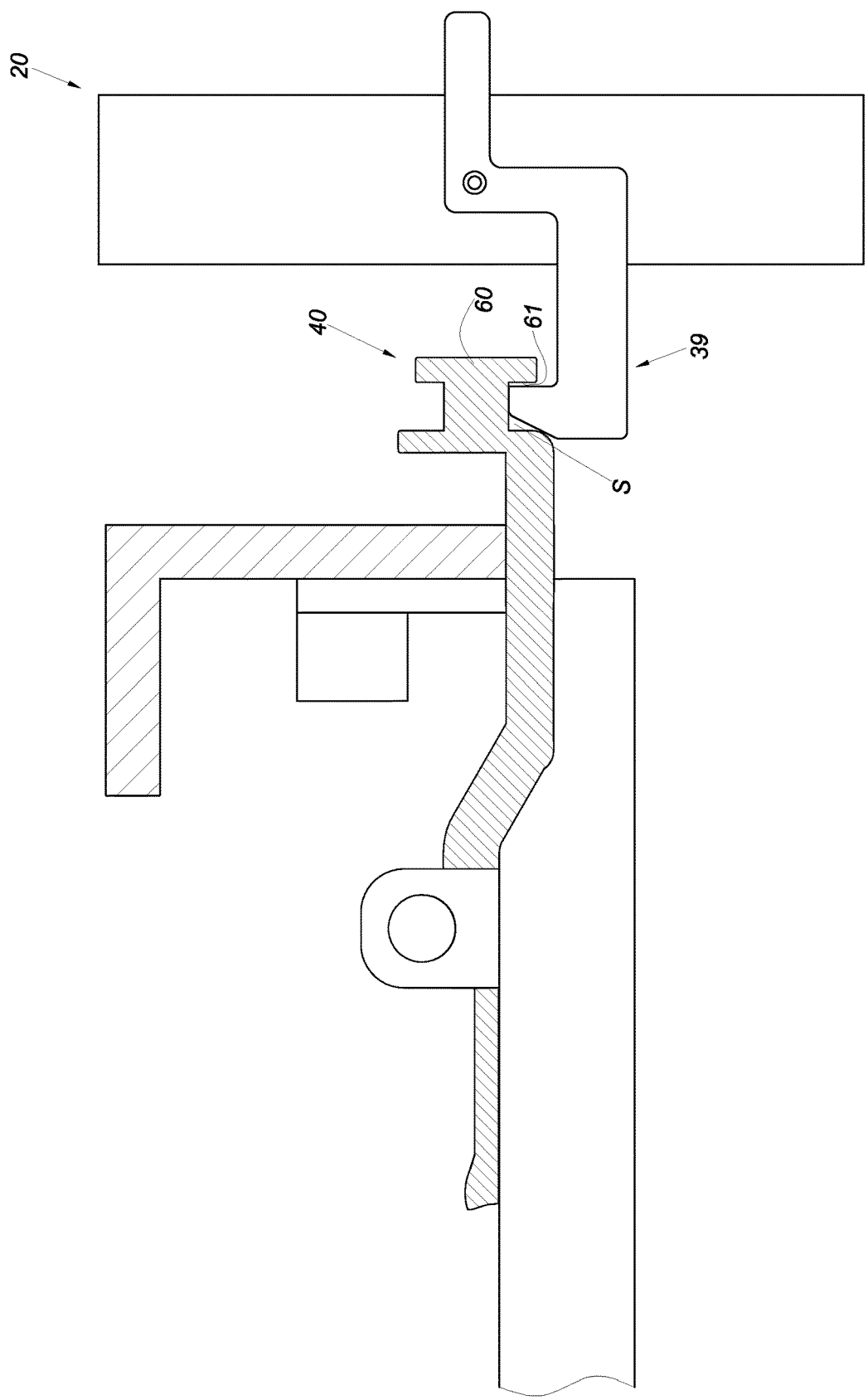
FIG. 14 shows that the second fastening member of an object and the engaging base of the bracket in an embodiment of the present invention are in a locked state.

FIG. 13 and FIG. 14 show how the second fastening member 39 of the object 20 is operated to engage with the second portion 60 of the engaging base 40. Preferably, the second fastening member 39 is provided with an auxiliary spring (not shown) for applying an elastic force to the second fastening member 39 to ensure that, after the operation, the second fastening member 39 will stay in a locked state in response to the elastic force.

Figure 15:
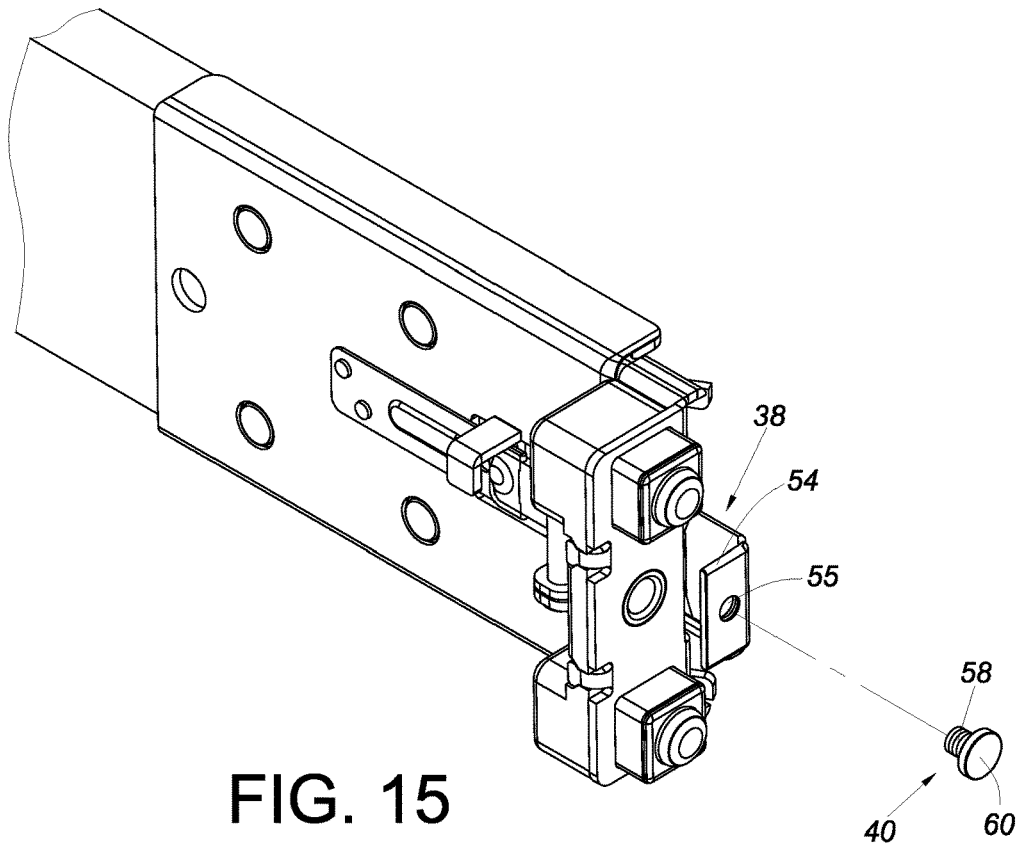
FIG. 15 is a perspective view showing that the engaging base and the first fastening member of the bracket in an embodiment of the present invention are in a separated state.
Figure 16:
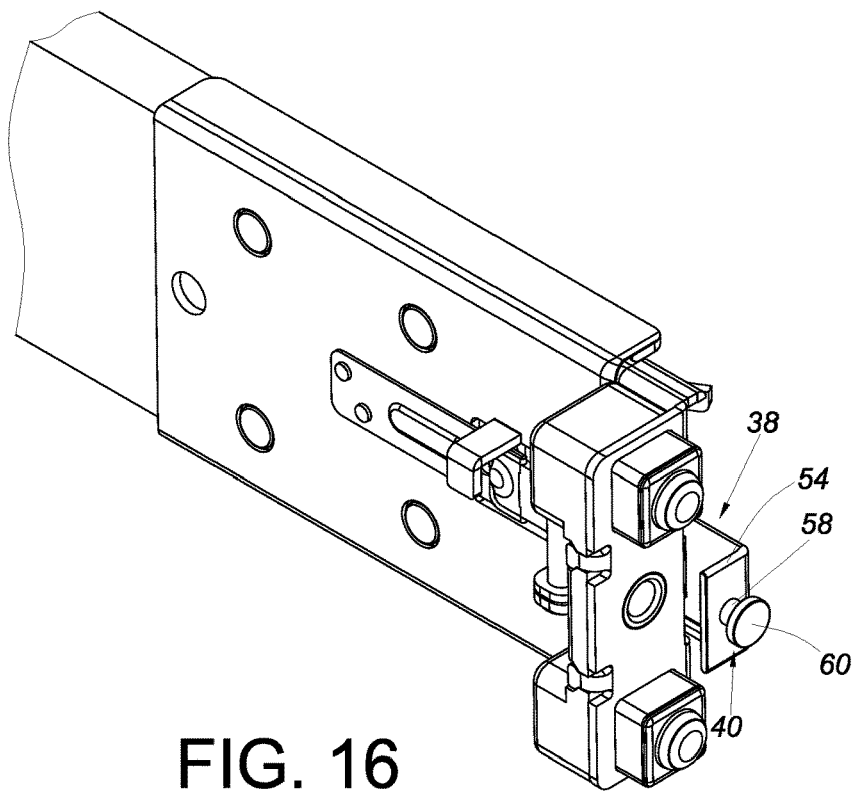
FIG. 16 is a perspective view showing that the engaging base and the first fastening member of the bracket in an embodiment of the present invention are in an assembled state.

In FIG. 15 and FIG. 16, the first fastening member 38 and the engaging base 40 are shown as components separable from each other. The engaging base 40 is detachably connected to the first fastening member 38, e.g., to the fastening portion 54 of the first fastening member 38. (It is worth mentioning that the engaging base 40 may be fixedly connected to the fastening portion 54 instead, by riveting for example.) More specifically, the engaging base 40 may be connected to the first fastening member 38 by threaded connection, mechanical engagement, or any other suitable detachable means. For example, the first portion 58 of the engaging base 40 may be threadedly connected to a threaded hole 55 in the fastening portion 54 of the first fastening member 38 such that the space S is formed between the second portion 60 of the engaging base 40 and the fastening portion 54 of the first fastening member 38. A user, therefore, may decide according to practical needs whether or not to mount the engaging base 40 to the first fastening member 38 to enable engagement with a target object (e.g., the second fastening member 39 of the object 20).

According to the above, the slide rail assembly and/or bracket disclosed herein preferably has the following features:

1. The engaging base and the first fastening member may be fixedly joined together as a single unit, and the engaging base provides a plurality of engaging features so that the second fastening member can engage with the engaging base from any direction in order not to detach from the engaging base.
2. The engaging base and the first fastening member may alternatively be components that are separable from each other. In that case, a user may decide, as appropriate, whether or not to mount the engaging base to the first fastening member.

While the present invention has been disclosed through the preferred embodiments described above, it should be understood that the embodiments are not intended to be restrictive of the scope of the invention. The scope of patent protection sought by the applicant is defined by the appended claims.

What is claimed is:

1. A bracket adapted for mounting a slide rail to a post having first and second surfaces on opposite sides thereof, the bracket comprising:
   a bracket plate for being attached to the slide rail;
   at least one mounting member connected to an end portion of the bracket plate, the mounting member being configured to mount to the post with the end portion of the bracket plate engaging the first surface of the post;
   a first fastening member movably mounted on the bracket plate, wherein a fastening portion of the first fastening member is configured to extend across the second surface of the post when the first fastening member is in a locking state; and
   an engaging base coupled to the first fastening member to be spaced from the post at an opposite side thereof with respect to the end portion of the bracket plate when the mounting member mounts to the post, the engaging base including a first portion and a second portion connected to the first portion defining a head member and a shank member secured to a surface of said first fastening member;
   wherein the second portion or head member of the engaging base includes a plurality of engaging features;
   the second portion or head member and the first fastening member surface form a space between the second portion or the head member and the surface of the first fastening member and defined by a length of said first portion or shank; and
   a second fastening member secured to an object supported by said slide rail, said second portion or head member is releasably coupled to the second fastening member.

2. The bracket of claim 1, wherein the first fastening member is pivotally connected to the bracket plate, and the bracket further includes an elastic member for applying an elastic force to the first fastening member and thereby keeping the first fastening member in the locking state.

3. The bracket of claim 1, wherein the first portion has a first contour, and the second portion has a second contour larger than the first contour.

4. The bracket of claim 1, wherein the space is an open space.

5. The bracket of claim 1, wherein the engaging base is fixedly joined to the first fastening member.

6. The bracket of claim 1, wherein the engaging base is detachably coupled to the first fastening member.

7. The bracket of claim 1, wherein the engaging features of the second portion of the engaging base are outwardly protrudingly provided with respect to the first portion over a range of 360 degrees so that the second fastening member is engageable with the second portion of the engaging base from any direction.

8. A slide rail assembly adapted for mounting an object to a rack, the slide rail assembly comprising:
    a first rail mountable to a first post and a second post of the rack via a first bracket and a second bracket respectively, each of the first and second posts having first and second surfaces on opposite sides thereof; and
    a second rail displaceable with respect to the first rail and configured for carrying the object;
    wherein the first bracket includes:
        a bracket plate including a lateral portion and an end portion bent with respect to the lateral portion;
        at least one mounting member located at the end portion of the bracket plate and configured to mount to the first post with the end portion of the bracket plate engaging the first surface of the first post;
        a first fastening member (38) movably mounted on the bracket plate;
        an elastic member for applying an elastic force to the first fastening member in order for a fastening portion of the first fastening member to extend across the second surface of the first post in response to the elastic force; and
        an engaging base coupled to the first fastening member to be spaced from the first post at an opposite side thereof with respect to the end portion of the bracket plate when the mounting member mounts to the first post, the engaging base including a first portion and a second portion defining a head member and a shank member secured to a surface of said first fastening member;
        wherein the second portion or head member of the engaging base includes a plurality of engaging features;
        the second portion or head member and the first fastening member surface form a space between the second portion or the head member and the surface of the first fastening member and defined by a length of said first portion or shank; and
        when the second rail is at a retracted position with respect to the first rail, a second fastening member of the object is releasably coupled to said second portion or head member.

9. The slide rail assembly of claim 8, wherein the first portion has a first contour, and the second portion has a second contour larger than the first contour.

10. The slide rail assembly of claim 8, wherein the space is an open space.

11. The slide rail assembly of claim 8, wherein the engaging base is fixedly joined to the first fastening member.

12. The slide rail assembly of claim 8, wherein the engaging base is detachably coupled to the first fastening member.

13. The slide rail assembly of claim 8, further comprising a third rail movably mounted between the first rail and the second rail.

14. The slide rail assembly of claim 8, wherein the engaging features of the second portion of the engaging base are outwardly protrudingly provided with respect to the first portion over a range of 360 degrees so that the second fastening member of the object is engageable with the second portion of the engaging base from any direction.

15. A bracket mountable to a post having first and second surfaces on opposite sides thereof, the bracket comprising:
    a bracket plate including a lateral portion and an end portion bent with respect to the lateral portion;
    at least one mounting member connected to the end portion of the bracket plate for mounting to the post with the end portion of the bracket plate engaging the first surface of the post;
    a first fastening member pivotally connected to the lateral portion of the bracket plate, wherein a fastening portion of the first fastening member is configured to extend across the second surface of the post when the first fastening member is in a locking state; and
    an engaging base coupled to the first fastening member to be spaced from the post at an opposite side thereof with respect to the end portion of the bracket plate when the mounting member mounts to the post, the engaging base including a first portion and a second portion defining a head member and a shank member secured to a surface of said first fastening member, wherein the first portion has a first contour, and the second portion has a second contour larger than the first contour;
    wherein the second portion or head member of the engaging base and the first fastening member surface form a space between the second portion or the head member and the surface of the first fastening member and defined by a length of said first portion or shank; and;
    a second fastening member secured to an object supported by a slid rail, said second portion or head member is releasably coupled to the second fastening member.

16. The bracket of claim 15, further comprising an elastic member for applying an elastic force to the first fastening member and thereby keeping the first fastening member in the locking state.

17. The bracket of claim 15, wherein the space is an open space.

18. The bracket of claim 15, wherein the engaging base is fixedly joined to the first fastening member.

19. The bracket of claim 15, wherein the engaging base is detachably coupled to the first fastening member.

20. The bracket of claim 15, wherein the second portion of the engaging base includes a plurality of engaging features outwardly protrudingly provided with respect to the first portion over a range of 360 degrees so that the second fastening member is engageable with the second portion of the engaging base from any direction.

* * * * *